United States Patent
Tsujimoto

(10) Patent No.: US 9,689,905 B2
(45) Date of Patent: Jun. 27, 2017

(54) POWER MEASUREMENT APPARATUS

(71) Applicant: OSAKA CITY UNIVERSITY, Osaka (JP)

(72) Inventor: Hiroaki Tsujimoto, Osaka (JP)

(73) Assignee: OSAKA CITY UNIVERSITY, Osaka (JP)

( * ) Notice: Subject to any disclaimer, the term of this patent is extended or adjusted under 35 U.S.C. 154(b) by 263 days.

(21) Appl. No.: 14/388,419

(22) PCT Filed: Mar. 19, 2013

(86) PCT No.: PCT/JP2013/001860
§ 371 (c)(1),
(2) Date: Jan. 9, 2015

(87) PCT Pub. No.: WO2013/145636
PCT Pub. Date: Oct. 3, 2013

(65) Prior Publication Data
US 2015/0115951 A1    Apr. 30, 2015

(30) Foreign Application Priority Data
Mar. 27, 2012    (JP) .................. 2012-072532

(51) Int. Cl.
*G01R 33/02*    (2006.01)
*G01R 21/08*    (2006.01)
(Continued)

(52) U.S. Cl.
CPC ............. *G01R 21/08* (2013.01); *G01R 21/00* (2013.01); *G01R 33/072* (2013.01); *G01R 1/00* (2013.01);
(Continued)

(58) Field of Classification Search
CPC . G01R 1/00; H01H 1/00; H01H 45/00; H01H 63/00; H01L 21/00; H01L 2221/00
See application file for complete search history.

(56) References Cited

U.S. PATENT DOCUMENTS 4,754,219 A * 6/1988 Milkovic ............... G01R 21/08
                                                         324/111
5,049,809 A    9/1991 Wakatsuki et al.
(Continued)

FOREIGN PATENT DOCUMENTS

CN    2450672 Y    9/2001
CN    2611909 Y    4/2004
(Continued)

OTHER PUBLICATIONS

Office Action issued in Japanese Patent Application No. 2012-072532 dated Apr. 6, 2016.
(Continued)

*Primary Examiner* — Jermele M Hollington
*Assistant Examiner* — Temilade Rhodes-Vivour
(74) *Attorney, Agent, or Firm* — Pearne & Gordon LLP

(57) ABSTRACT

A power measurement apparatus configured to measure power consumed at a load, the apparatus includes a magnetic film module, an adjuster, a measurement resistance, and a voltage detector. The magnetic film module is arranged so that a longitudinal direction of the magnetic film module is parallel to current flowing in the load. The adjuster is configured to adjust a pass-frequency and a phase of a voltage at one terminal of the magnetic film module. The measurement resistance is serial-connected to the magnetic film module. The voltage detector is configured to detect a voltage between both terminals of the magnetic film module.

15 Claims, 4 Drawing Sheets

(51) Int. Cl.
    *G01R 21/00*     (2006.01)
    *G01R 33/07*     (2006.01)
    *G01R 1/00*     (2006.01)
    *H01H 1/00*     (2006.01)
    *G01R 1/20*     (2006.01)
    *G01R 15/14*     (2006.01)
    *G01R 15/20*     (2006.01)

(52) U.S. Cl.
    CPC ............ *G01R 1/203* (2013.01); *G01R 15/142* (2013.01); *G01R 15/205* (2013.01); *H01H 1/00* (2013.01); *H01L 2221/00* (2013.01)

(56) References Cited

U.S. PATENT DOCUMENTS

| | | | |
|---|---|---|---|
| 5,343,143 A * | 8/1994 | Voisine | G01R 11/067 324/107 |
| 2004/0150397 A1 * | 8/2004 | Kuroe | G01R 33/02 324/249 |
| 2005/0219771 A1 * | 10/2005 | Sato | B82Y 25/00 360/324.2 |
| 2007/0024269 A1 | 2/2007 | Tadatsu | |
| 2010/0301837 A1 * | 12/2010 | Higuma | G01R 21/133 324/140 R |
| 2011/0221436 A1 * | 9/2011 | Ichinohe | G01R 15/205 324/252 |
| 2012/0229131 A1 | 9/2012 | Takenaga et al. | |
| 2014/0049253 A1 | 2/2014 | Tsujimoto | |
| 2015/0219700 A1 | 8/2015 | Tsujimoto | |

FOREIGN PATENT DOCUMENTS

| | | |
|---|---|---|
| EP | 0163460 A1 | 5/1985 |
| JP | 59-173771 A | 10/1984 |
| JP | 61-017071 A | 1/1986 |
| JP | 62-066413 A | 3/1987 |
| JP | 64-74457 A | 3/1989 |
| JP | 01-250875 A | 10/1989 |
| JP | 2000-187048 A | 7/2000 |
| JP | 2005-106632 A | 4/2005 |
| JP | 2005-236815 A | 9/2005 |
| JP | 2011-47731 A | 3/2011 |
| JP | 2011047730 A | 3/2011 |
| JP | 2013/238434 A | 11/2013 |
| WO | 2012-105459 A1 | 8/2012 |

OTHER PUBLICATIONS

H. Yoda, "A New Electric Power Sensor Module Using Magnetoresistive Thin Film", Session GP, 1989, Kawasaki, Japan.
Chinese Office Action for Application No. 201380027150.5 dated Apr. 22, 2016.
Chinese Search Report for Application No. 2013800271505 dated Apr. 22, 2016.
Office Action for Japanese Application No. 2012-072532, Dated Nov. 17, 2015.
Supplementary European Search Report dated Feb. 10, 2016 for EP 13769691.
Yoda, et al. "A new electric power sensor module using magnetoresistive thin film." IEEE Transactions on Magnetics, IEEE Service Center, New York, NY, vol. 25, No. 5., Sep. 1, 1989, p. 3821-3823.
International Search Report for Application No. PCT/JP2013/001860 dated Jun. 25, 2013.
Hiroaki Tsujimoto, Yosuke Tsuzaki, "Magentic thin film power sensor using a magneto resistance effect", The Institute of Electrical Engineers of Japan Kenkyukai Shiryo. MAG, Magnetics Kenkyukai, Nov. 24, 2011 (Nov. 24, 2011).

* cited by examiner

POWER MEASUREMENT APPARATUS

TECHNICAL FIELD

The present invention relates to an apparatus for measuring electrical power, and in particular, to a power measurement apparatus using a magnetoresistance effect of a magnetic film.

BACKGROUND ART

In an alternate current, since there is a phase difference between voltage and current, reactive power is caused due to the difference. Along with measurement of active power which is power consumption of an induction motor and energy-saving efforts, it is increasingly important to visualize electrical power by measuring reactive power, apparent power, power factor, and the like, from the viewpoint of thorough effective utilization of energy.

Power consumption in an induction motor varies largely according to input voltage, input current, frequencies, and the magnitude of a load. Conventionally, current, voltage, and a phase difference (θ) of "current-voltage" are measured separately, and then "voltage*current*power factor (cos θ)" is calculated by an arithmetic operation.

In order to measure power consumption, systems using current transformer (CT) and shunt resistance have been used widely as means for measuring current. However, current transformer (CT) involves restrictions on the installation space, and is expensive. Accordingly, it is not easy to use CT when power consumption is desired to be measured in various locations. On the other hand, a shunt resistance system involves restrictions on the installation space, consumes energy wastefully, and incidentally leaves a heating problem.

Meanwhile, as a smaller power meter, one using a Hall element has been proposed conventionally. In Patent Literature 1, active power, reactive power, phases, and power factor are measured using two Hall effect elements. In Patent Literature 2, when measurement is performed by a Hall effect element, electrical power of a load is measured accurately by considering effects of a self-magnetic field error term caused by the generated control current.

CITATION LIST

Patent Literature

Patent Literature 1: JP 2000-187048 A
Patent Literature 2: JP 61-17071 A

SUMMARY OF INVENTION

Technical Problem

Considering the viewpoint of power saving and a use of electrical power for driving mobile bodies such as automobiles, it is necessary to measure electrical power at various locations. In order to meet such demands, a power measurement apparatus having a small sensor and an easy-to-use meter is needed. As a means that measures electrical current to measure power consumption, a system using CT or shunt resistance is not able to meet such demands because of its size, as described above.

Since the apparatuses described in Patent Literatures 1 and 2 use Hall elements, the apparatuses can be smaller compared with those using the systems of CT and shunt resistance. However, using a plurality of devices for measuring power consumption at one location becomes a primary cause of the apparatus not being downsized. Further, it cannot be said that preparing the circuit of Patent Literature 2 for measurement at a narrow place is easy.

Further, a Hall element must be installed such that a magnetic field from a vertical direction is applied to a planar device. This causes a problem that it is impossible to attach a plane surface, on which a device is formed, to a lead wire when it picks up a magnetic field from the lead wire. If a plane surface, on which a device is formed, is attached to a lead wire, a magnetic field from the lead wire is only applied to the inside of the device surface, whereby it is difficult to achieve a Hall effect.

Solution to Problem

The present invention is made in view of the above-described problem, and is a power measuring apparatus using a magnetoresistance effect having a magnetic film. More specifically, according to the present invention, the power measurement apparatus that measures electrical power consumed in a load connected with a power source via a connecting line, the apparatus includes:
  a pair of coupling ends for coupling to the power source in parallel with the load;
  a sensor element including:
    a magnetic film module including a magnetic film;
    a pair of sensor terminals provided on both sides of the magnetic film module, one end of the sensor terminals being connected with one of the coupling ends; and
    a bias means that gives an operating point to the magnetic film module, wherein
  the sensor element is arranged adjacent to the connecting line via an insulation layer such that a longitudinal direction of the magnetic film module is substantially parallel to a direction of current flow in the connecting line;
  n pieces of bandpass filters connected in parallel with another end of the sensor terminals of the sensor element;
  phase adjusters connected in series with the bandpass filters, respectively;
  a selection switch that selectively connects the phase adjusters;
  a measurement resistance in which one end is connected with the selection switch and another end is connected with another end of the coupling ends; and
  a voltage detector that uses the respective sensor terminals as measurement terminals, and measures voltage between the measurement terminals.

Advantageous Effects of Invention

A power measurement apparatus according to the present application is able to measure not only active power but also reactive power and power factor by one sensor in details of an induction motor, by using advantages of a magnetic thin-film power sensor such as non-contact (principle), easy to install (microminiature, thin), and power saving (small energy consumption when measurement). Therefore, it is possible to visualize a status of power consumption, and thus, power-saved driving control depending on the status of driving and load by applying the apparatus on the induction motor.

DESCRIPTION OF EMBODIMENTS

Hereinafter, a power measurement apparatus according to the present invention will be described with reference to the drawings. The following description exemplary shows an embodiment of the present invention, and the present invention is not limited to the following embodiment. The following embodiment can be changed insofar as the changes do not depart from the aim of the present invention.

Figure 1:
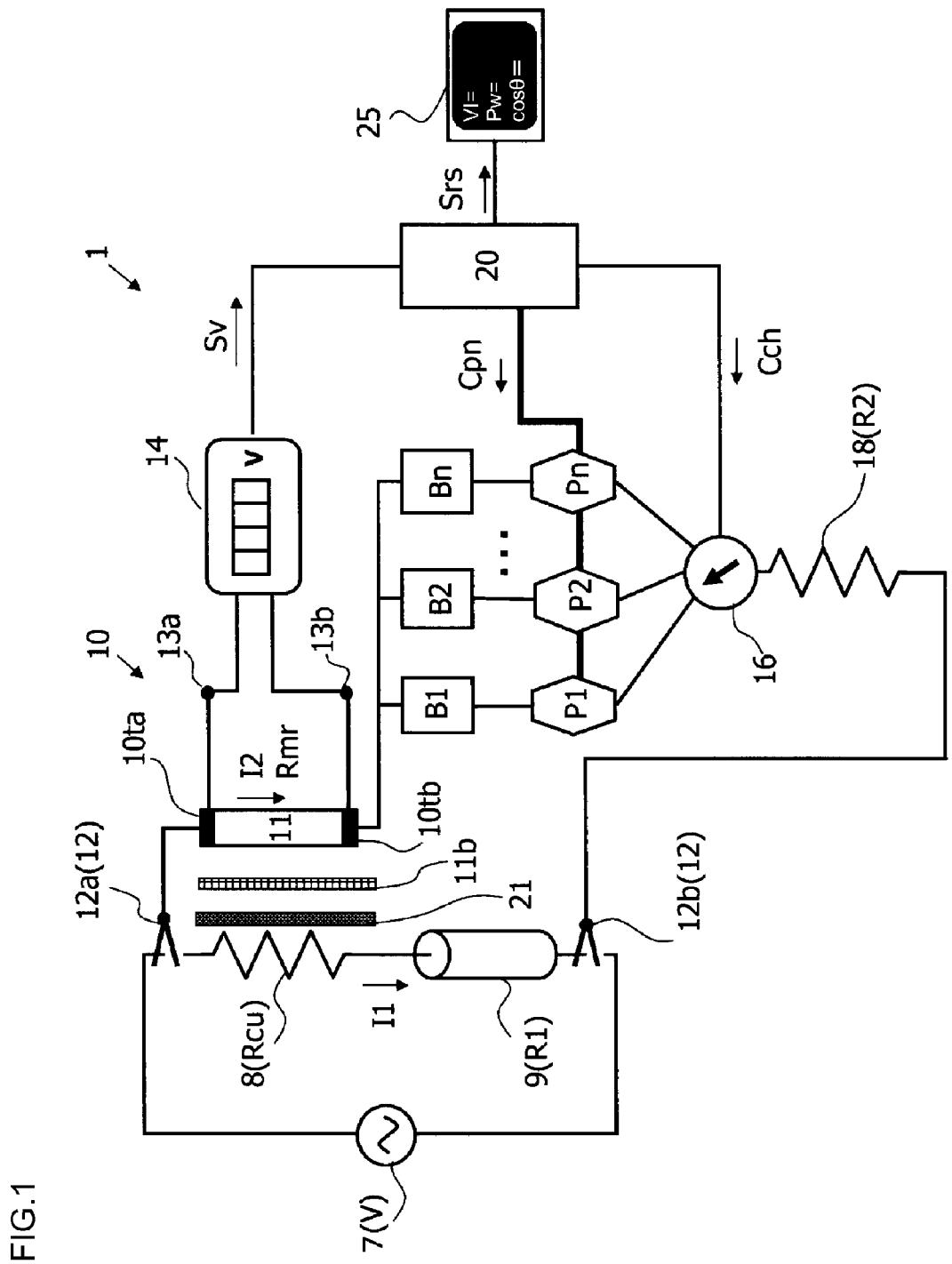
FIG. 1 is a diagram illustrating a configuration of a power measurement apparatus according to the present invention.

FIG. 1 is a diagram illustrating a configuration of a power measuring apparatus of the present invention. The power measuring apparatus 1 of the present invention includes coupling ends 12, a sensor element 10, a voltage detector 14, a selection switch 16, a measurement resistance 18, n pieces of bandpass filters Bn, and n pieces of phase adjusters Pn. A control device 20 may also be included. The power measurement apparatus 1 of the present invention measures electrical power consumed by a load 9 (resistance value is R1) connected with a power source 7. The power source 7 and the load 9 are connected with each other via a connecting line 8 (resistance value is Rcu).

The coupling ends 12 are terminals for connecting the power measurement apparatus 1 in parallel with the load 9 with respect to the power source 7 of the circuit which is to be a measurement target. Accordingly, the coupling ends are provided in a pair, each of which is called a coupling end 12a or 12b when they are distinguished from each other.

The sensor element 10 is a device using a magnetoresistance effect of a magnetic film. As a structure of the sensor element 10, a pair of sensor terminals 10t formed on both ends of a thin-film magnetic film module 11. A resistance value of the magnetic film module 11 is Rmr. Each of the sensor terminals 10t is called a sensor terminal 10ta or 10tb when they are distinguished from each other. The sensor terminals 10t also serve as measurement terminals 13. Therefore, the measurement terminals 13 are also provided in a pair, each of which is called a measurement terminal 13a or 13b.

The sensor element 10 is equipped with a bias means 11b. The bias means 11b is a permanent magnet which applies a bias magnetic field in order to give an operating point to the magnetic film module 11, for example. The bias means 11b may be an electromagnet. In the case where an operating point is provided originally without applying a bias magnetic field from a magnet due to the structure of the magnetic film module 11, it can be said that the bias means 11b is provided as well.

Further, the sensor element 10 is arranged on the connecting line 8 flowing to the load 9, via an insulation layer 21. A specific arrangement position may be neighborhood of the load 9, neighborhood of the power source 7, or in the middle of the connecting line 8. This is because the sensor element 10 operates by detecting a magnetic field caused by the current in the connecting line 8. Therefore, it is preferable that the insulation layer 21 is thin.

The insulation layer 21 works to prevent direct contact between the magnetic film module 11 and the connecting line 8. Accordingly, the insulation layer 21 may be a cover of the connecting line 8.

The voltage detector 14 is a voltmeter which measures a voltage between the measurement terminals 13a and 13b. The voltage detector 14 may be configured to display a voltage between the measurement terminals 13, or output a measured voltage value as a signal Sv.

One sensor terminal 10ta of the sensor element 10 is connected with one coupling end 12a. Further, the other sensor terminal 10tb of the sensor element 10 is connected with n pieces of the bandpass filters Bn. Here, n represents an integer of one or more. Although the bandpass filters Bn are distinguished from each other by reference signs B1, B2, . . . , Bn, respectively, the entire bandpass filters are denoted by a reference sign Bn. The bandpass filters Bn are previously set so as to flow current of predetermined bandwidths, respectively. Of course, the predetermined bandwidths may be changed from the outside. The bandpass filters Bn are arranged in parallel, and are connected with the other sensor terminal 10tb.

In the latter stage of the bandpass filters Bn, the phase adjusters Pn are connected in series with the respective bandpass filters Bn. The phase adjusters Pn are also provided in n pieces, as in the case of the bandpass filters Bn. While the respective phase adjusters Pn are called phase adjusters P1, P2, and the like when they are distinguished from each other, the phase adjusters are called phase adjusters Pn when they are called as a whole.

The phase adjusters Pn are configured to change the phase of the current flowing from the bandpass filters Bn using a reactance effect. The degree of change is controlled by a signal Cpn from the outside. The signal Cpn represents a control signal with respect to the n-th phase adjuster Pn. As such, a control signal transmitted to the second phase adjuster P2 is called a signal Cp2. The phase adjusters Pn may be configured of a digital filter. Further, the phase adjusters Pn may be manually adjustable.

The n pieces of phase adjusters Pn are connected with one selection switch 16. The selection switch 16 is a switch having n pieces of connecting terminals and one output terminal. One of the n pieces of phase adjusters Pn connected thereto is electrically conducted with the output terminal. This means that current only flows to a path of one of the bandpass filters Bn and one of the phase adjusters Pn selected by the selection switch 16.

With the output terminal of the selection switch 16, the measurement resistance 18 is connected in series. The resistance value of the measurement resistance 18 is R2. The resistance value R2 of the measurement resistance 18 needs to be sufficiently larger with respect to the resistance value Rmr of the magnetic film module 11. As described below, when R2 is sufficiently larger than Rmr, it can be considered that the current I2 flowing into the magnetic film module 11 is determined only depending on the voltage (V) of the power source 7 and the resistance value R2 of the measurement resistance 18. The other end of the measurement resistance 18 is connected with the other coupling end 12b.

The control device 20 may be a computer configured of a memory and a micro processor unit (MPU). The control device 20 is connected with at least the voltage detector 14, the n pieces of phase adjusters Pn, and the selection switch 16, and controls them.

Figure 2:
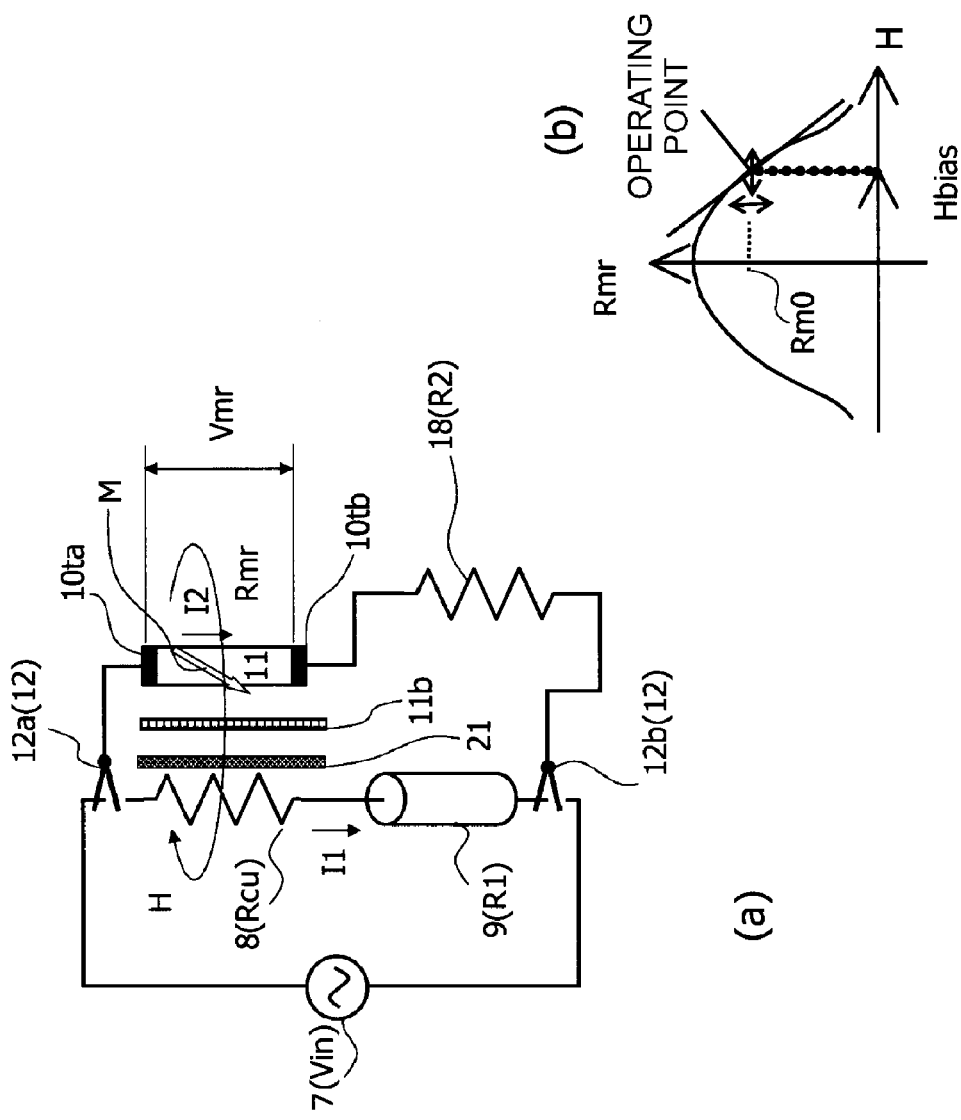
FIG. 2 is a diagram illustrating a measurement principle of the power measurement apparatus according to the present invention.

Next, the measurement principle of the power measurement apparatus 1 of the present invention will be described briefly using FIG. 2. FIG. 2(a) illustrates FIG. 1 in a simpler way in order to describe the measurement principle. The bandpass filters Bn and the phase adjusters Pn are omitted. The same constituent elements as those in FIG. 1 are denoted by the same reference signs. The voltage of the power source 7 is determined to be Vin. When current I1 flows to the load 9 (resistance value R1) via the connecting line 8 (resistance value Rcu), a magnetic field H is generated around the connecting line 8.

Further, on the side of the power measurement apparatus 1 connected with the power source 7 in parallel with the load 9, current I2, determined according to the power source 7 and the measurement resistance 18, flows. The magnetic film module 11, in which the current I2 flows, is arranged in the magnetic field H generated around the connecting line 8 in such a manner that the direction of the current I2 becomes substantially parallel to the current I1 of the connecting line 8. On the magnetic film module 11, the magnetic field H from the connecting line 8 is acted in a direction perpendicular to the current I2. Then, the magnetization M of the magnetic film module 11 is rotated by the magnetic field H. Along with it, the resistance value Rmr of the magnetic film module 11 is changed by the magnetoresistance effect.

FIG. 2(b) illustrates a relationship between the magnetic field H applied to the magnetic film module 11 and the resistance value Rmr of the magnetic film module 11. The horizontal axis shows the intensity of the applied magnetic field H, and the vertical axis shows the resistance value Rmr of the magnetic film module 11. While the resistance value is Rmr when the magnetic field H is not applied, when the magnetic field H is applied and thus the magnetization M is changed by the direction and the magnitude of the current, the resistance value Rmr varies. The variation includes the case where the resistance value Rmr decreases and the case where the resistance value Rmr increases, both of which are called magnetoresistance effects.

Here, by applying a bias magnetic field Hbias to the magnetic film module 11 by the bias means 11b, the resistance value Rmr proportional to the current I1 flowing in the connecting line 8 can be obtained. The point where the bias magnetic field Hbias is applied is an operating point Rm0.

Here, it is assumed that the resistance value at the operating point is Rm0, and the proportionality factors are a and R. When a change in the resistance in the magnetic film module 11 is defined as ΔRmr and the resistance of the magnetic film module 11 is defined as Rmr, the voltage Vmr of the magnetic film module 11 is represented by the following Expression (1).

[Mathematical formula 1]

$$H = \alpha I_1 \quad (1)$$
$$\Delta R_{mr} = \beta H = \beta(\alpha I_1)$$
$$R_{mr} = R_{m0} + \Delta R_{mr} = R_{m0} + \alpha\beta I_1$$
$$V_{mr} = R_{mr}I_2 = (R_{m0} + \Delta R_{mr})I_2 = (R_{m0} + \alpha\beta I_1)I_2$$

Further, it is assumed that the voltage of the power source 7 to the load 9 is Vin, and the amplitude thereof is V1. Then, the voltage Vmr of the magnetic film module 11 is calculated so as to be in proportion to the product of V1 (amplitude of power source), R1 (resistance value of load), and cos θ (power factor), as shown by the following Expression (2).

[Mathematical formula 2]

$$V_{in} = V_1 \sin\omega t \quad (2)$$
$$I_1 = \frac{V_1}{R_1}\sin(\omega t - \theta) \quad I_2 = \frac{V_1}{R_2}\sin\omega t$$
$$V_{mr} = (R_{m0} + \alpha\beta I_1)I_2$$
$$= \left(R_{m0} + \alpha\beta\frac{V_1}{R_1}\sin(\omega t - \theta)\right)\frac{V_1}{R_2}\sin\omega t$$
$$= \frac{R_{m0}V_1}{R_2}\sin\omega t - \alpha\beta\frac{V_1}{R_1}\frac{V_1}{R_2}\frac{1}{2}\cos(2\omega t - \theta) + \alpha\beta\frac{V_1}{R_1}\frac{V_1}{R_2}\frac{1}{2}\cos\theta$$
$$= AC\ component + DC\ component\left(k*\frac{V_1^2}{R_1}\cos\theta\right)$$

The relationships of Rmr<<R2 and Rcu<<R1 are used here.

The last expression of the above-described expression is a sum of an AC component and a DC component. This means that in the output voltage Vmr in the longitudinal direction of the magnetic film module 11, an AC voltage and a DC voltage appear in an overlapped state. Moreover, the DC component is in proportion to the active power (I1*V1=V1²/R1) cos θ in the load 9. As such, by measuring only the DC voltage component in the longitudinal direction of the magnetic film module 11, it is possible to measure power consumption (active power) of the load 9 with respect to the AC input.

Further, when the power source Vin includes an nth-order harmonic, a voltage between both ends of the magnetic film module 11 is represented by the following Expression (3), similarly. Similar to the above description, it is assumed that the voltage of the power source is Vin, the current flowing through the load 9 is I1 and the current flowing through the magnetic film module 11 is I2.

[Mathematical formula 3]

$$V_{in} = \sum_{n=1}^{\infty} V_n \sin n\omega t \quad (3)$$
$$I_1 = \sum_{n=1}^{\infty} \frac{V_n}{R_1}\sin(n\omega t - \theta_n)$$
$$I_2 = \frac{V_m}{R_2}\sin m\omega t$$
$$V_{mr} = (R_{m0} + \alpha\beta I_1)I_2$$
$$= \left(R_{m0} + \alpha\beta\sum_{n=1}^{\infty}\frac{V_n}{R_1}\sin(n\omega t - \theta_n)\right) \cdot \frac{V_m}{R_2}\sin m\omega t$$
$$= AC\ component + DC\ component\left(k*\frac{V_m^2}{R_1}\cos\theta_m\right)$$

The last expression of Expression (3) is a sum of the AC component and the DC component of each frequency component. As such, in the power measurement apparatus 1 according to the present invention, even in the case where voltage and current include a radio-frequency wave, an AC voltage and a DC voltage appear in an overlapped state in the output voltage Vmr in the longitudinal direction of the magnetic film module 11 as a measurement principle. The DC voltage component of the output voltage Vmr, which is a voltage between the both ends of the magnetic film module 11, is a DC voltage which is a total of a DC voltage proportional to the power consumption due to the fundamental wave and a DC voltage proportional to the power consumption due to the harmonic.

Accordingly, in the power measurement apparatus 1 of the present invention, even in the case where the power source includes a harmonic component, it is possible to measure power consumption (which is active power including power factor) in the load 9 (resistance value R1) by measuring only the DC voltage in the longitudinal direction of the magnetic film module 11.

Figure 3:
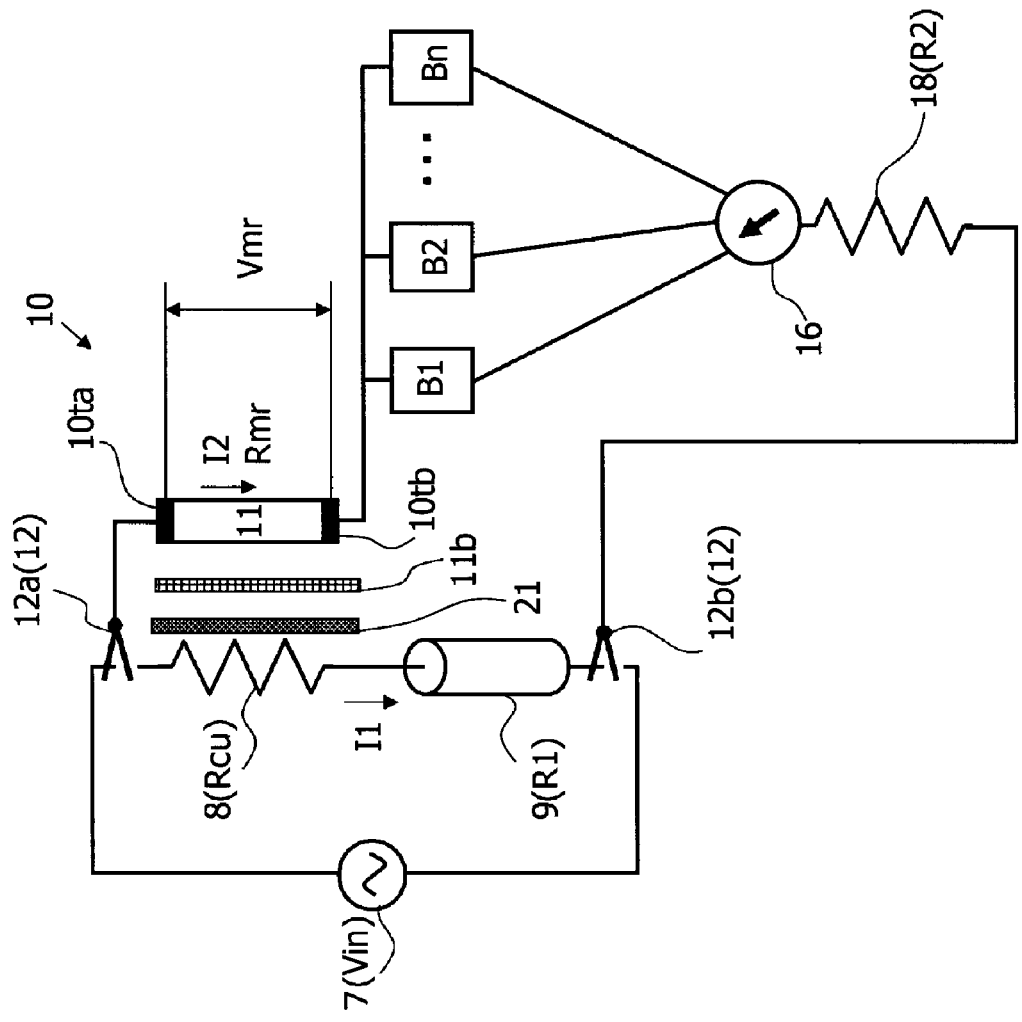
FIG. 3 is a diagram illustrating a measurement principle of the power measurement apparatus according to the present invention.

FIG. 3 illustrates a configuration of the power measurement apparatus in the case where the power source 7 includes a harmonic. Here, the bandpass filters Bn are arranged along with the selection switch 16. The bandpass filters Bn are set so as to pass through the respective frequency components described above.

In this case, only a signal of a frequency selected by the selection switch 16 passes through the magnetic film module 11, which can be observed as the output voltage Vmr. Even in this example, the output voltage Vmr of the magnetic film module 11 is in proportion to the active power of the selected frequency in the load 9. As such, it is possible to calculate power consumption at the selected frequency.

As described above, by measuring the voltage of the magnetic film module 11, it is possible to measure power consumption in the load 9.

Referring back to FIG. 1 again, operation of the power measurement apparatus 1 of the present invention will be described. When the phase adjustment quantity of a phase adjusters P1 is set to zero, the power measurement apparatus 1 of the present invention is in a state which is the same as the state where the harmonic is overlapped on the power source as shown in FIG. 3.

For example, the bandpass filter B1 is selected by the selection switch 16. The bandpass filter B1 is assumed to be a filter which passes the frequency of the fundamental wave, and when the phase adjustment quantity of the phase adjusters Pn is set to zero, a voltage proportional to the power consumed in the load 9 of the fundamental wave of the power source 7 is obtained from the voltage detector 14. This means that the active power of the fundamental wave can be obtained. Even in the case of other harmonics, the active power can be obtained similarly.

Here, the output voltage Vmr of the magnetic film module 11 is measured by changing the phase adjustment quantity. As a specific example, it is assumed that the bandpass filter B1 is selected by the selection switch 16. Then, the phase adjustment quantity of the phase adjuster P1 is changed from $-\pi/2$ to $\pi/2$ at a maximum. At this time, the phase adjustment quantity in which the maximum output voltage can be obtained is assumed to be $\phi m$. In this case, $\cos \phi m$ equals to the power factor, and the output voltage obtained at this time is in proportion to the apparent power (VI).

The reason thereof is as described below. When the phase adjustment quantity is zero, a value in proportion to the value (active power) obtained by multiplying the power consumption in the load 9 by the power factor can be obtained, as described in the measurement principle illustrated of FIG. 3. This is described as $(V1^2/R1)\cos \theta$ in an expression. Description will be given again on the case of fundamental wave. When the phase quantity $\phi$ is changed by the phase adjuster P1, the output voltage of the magnetic film module 11 becomes a maximum at the phase $\phi m$. This means that $\cos(\theta-\phi m)=1$ is satisfied, and at this time, $\phi m=\theta$.

This means that $\phi m=\theta$ is satisfied, and $\phi m$ is an angle showing power factor, that is, a power factor angle. Further, when $\cos(\theta-\phi m)=1$, the voltage of the magnetic film module 11 is a voltage proportional to $(V1^2/R1)$, which represents apparent power.

Further, by adjusting the phase quantity by the phase adjuster P1, calculating the maximum output voltage (proportional to apparent power) obtained at the magnetic film module 11, and dividing the output voltage (active power) when the phase quantity is zero by the maximum output voltage, power factor ($\cos \theta$) can be obtained. As the apparent power and the power factor angle or the power factor can be obtained, the reactive power can be obtained immediately by calculating the apparent power*$\sin \theta$ (or $\sin \phi m$).

The control device 20 may measure these values at predetermined time intervals and accumulate them. By performing such accumulation, the power measurement apparatus 1 of the present invention also works as an electric energy meter. Further, such information can be output using a signal Srs. While FIG. 1 illustrates an example in which such information is output on the display 25, the output destination is not necessarily the display 25, and it may be another control device.

Figure 4:
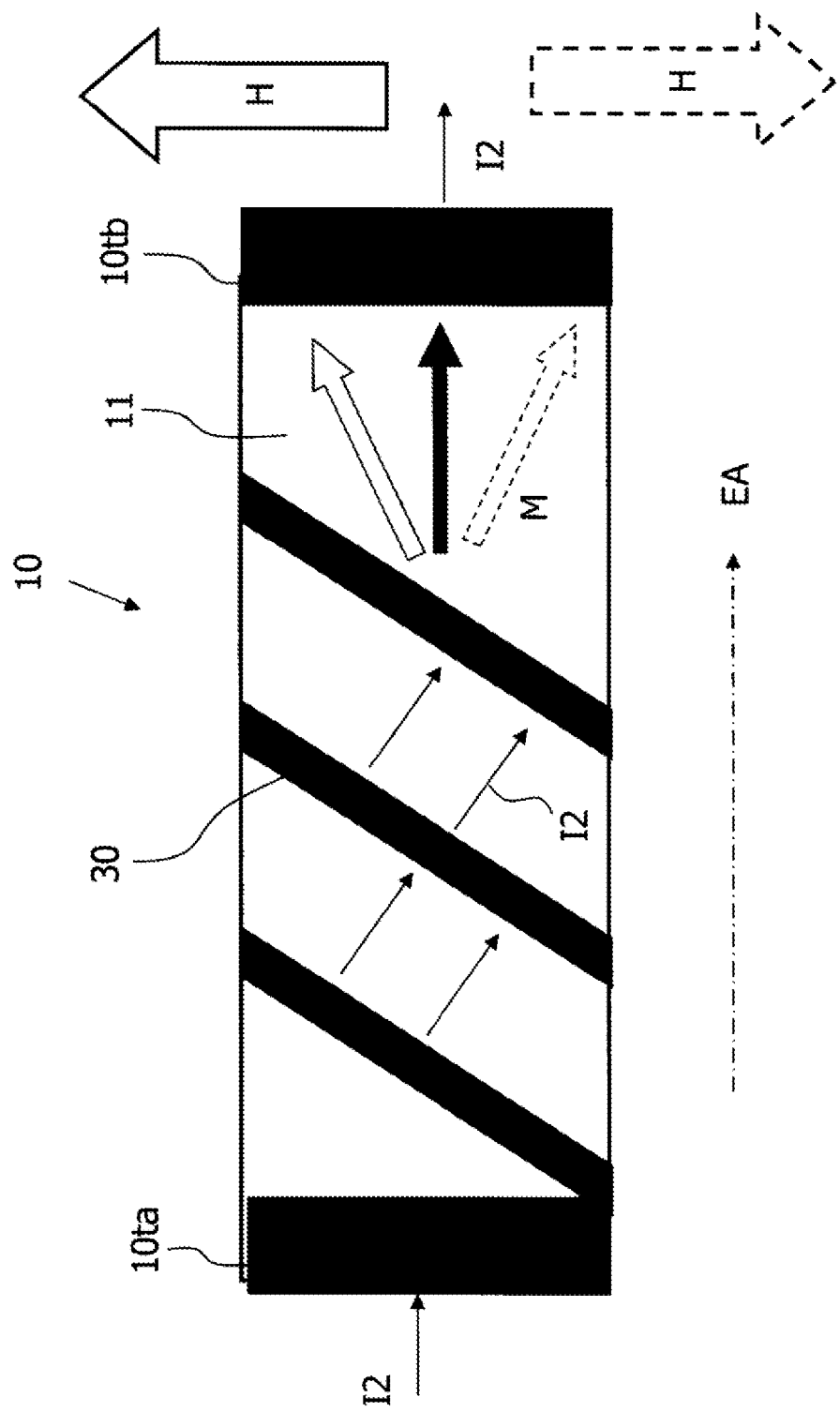
FIG. 4 is a diagram illustrating another embodiment of a sensor element used in the power measurement apparatus according to the present invention.

FIG. 4 describes a variation of the sensor element 10. As described above, the power measurement apparatus 1 of the present invention observes the voltage Vmr proportional to the power consumption in the load 9 due to the magnetoresistance effect of the magnetic film module 11. As also illustrated in FIG. 2(*b*), the magnetic film module 11 is an even function with respect to a magnetic field applied from the outside, and it is impossible to obtain a resistance value proportional to the applied magnetic field. As such, in FIG. 1, a magnetic field generating source such as a permanent magnet is arranged near the magnetic film module 11 as the bias means 11*b* to generate a bias magnetic field, and an operating point is obtained. However, there is also a method of obtaining an operating point without using the magnetic field generating source such as a magnet.

FIG. 4 illustrates another embodiment of the sensor element 10. On the magnetic film module 11, conductors 30 are formed in strips. Further, it is assumed that the magnetic film module 11 is configured such that a magnetization easy axis EA is induced in a longitudinal direction. It is preferable to use the conductors 30 made of a material having a sufficiently low resistance, compared with the resistance of the magnetic film module 11.

Operation of the sensor element 10 will be described. Current is made to flow between the sensor terminals 10*ta* and 10*tb*. The current I2 input from the sensor terminal 10*ta* is necessary to flow on the magnetic film module 11 when it flows from the conductor 30 to the conductor 30 formed in stripes.

As the magnetic film module 11 has a higher resistance than that of the conductors 30, the current flows a shortest distance between the conductors 30. When viewed from the longitudinal direction of the magnetic film module 11, the current flows in an inclined direction. Here, as the magnetization easy axis EA of the magnetic film module 11 is induced in the longitudinal direction of the sensor element 10, the inclination is made in a direction of the magnetization M and the current I2.

Here, when the magnetic field H (dotted line arrow) is applied to the magnetic film module 11 in a direction from top to bottom on the sheet, the magnetization M (dotted line arrow) rotates along with it. Then, as an angle formed between the rotated magnetization M and the current I2 decreases, the resistance of the magnetic film module 11 becomes large. On the contrary, when the magnetic field H is applied (solid line arrow) in a direction from bottom to top on the sheet, the magnetization M (solid line arrow) rotates in a direction away from the current I2.

Accordingly, the resistance of the magnetic film module 11 decreases. As such, in this way, by setting an angle between the direction of current flow and the magnetization direction in advance in a state where a magnetic field is not applied from the outside, the state appears as if a bias magnetic field is applied. Although FIG. 4 illustrates the configuration in which the direction of current flow is changed from the direction of the magnetization easy axis EA, it is also possible to induce the magnetization easy axis EA so as to have an angle with respect to the longitudinal direction of the magnetic film module 11 in advance, for example.

Further, a structure formed by combining these structures, or structures other than these structures are also acceptable.

The sensor element 10 configured in this way may also be considered as the sensor element 10 having the bias means 11b, and the power measurement apparatus 1 illustrated in FIG. 1 may be equipped with such a sensor element 10.

As described above, the power measurement apparatus 1 of the present invention is able to obtain apparent power, active power, power factor, and reactive power, at a frequency selected by the bandpass filters Bn. This is very effective in measuring power of a load in which power factor varies according to the operating state, such as an induction motor. For example, in the case of a motor or the like, a control method for controlling operation such that power factor becomes a maximum according to the circumstances may also be considered.

INDUSTRIAL APPLICABILITY

The present invention is widely applicable as a power measurement apparatus to be used in the fields using electricity, such as home electric appliances, automobiles, industrial equipment.

REFERENCE SIGNS LIST 1 power measurement apparatus
7 power source
8 connecting line (resistance)
9 load
10 sensor element
10t (10ta, 10tb) sensor terminal
11 magnetic film module
11b bias means
12 (12a, 12b) coupling end
13 (13a, 13b) measurement terminal
14 voltage detector
16 selection switch
18 measurement resistance
21 insulation layer
25 display

The invention claimed is:

1. A power measurement apparatus configured to measure power consumed at a load, the apparatus comprising:
   a magnetic film module arranged so that a longitudinal direction of the magnetic film module is parallel to current flowing in the load;
   an adjuster configured to adjust a pass-frequency and a phase of a current flowing through the adjuster from the magnetic film module;
   a measurement resistance serial-connected to the magnetic film module; and
   a voltage detector configured to detect a voltage between two terminals of the magnetic film module.

2. The apparatus of claim 1, wherein the adjuster comprises:
   a plurality of parallel-connected band-pass-filters connected to the one terminal of the magnetic film module;
   a plurality of phase adjusters, each of which being serial-connected to each of the band-pass-filters; and
   a switch configured to select one of outputs from the phase adjusters.

3. The apparatus of claim 1, wherein the adjuster is configured to adjust the phase so as to maximize an output voltage from the voltage detector.

4. The apparatus of claim 3 further comprising a controller configured to calculate a power factor angle based on the phase when the output voltage from the voltage detector becomes maximum.

5. The apparatus of claim 3 further comprising a controller configured to calculate apparent power based the output voltage from the voltage detector when the output voltage becomes maximum.

6. The apparatus of claim 1 further comprising a controller configured to calculate effective power based on the output voltage from the voltage detector when an adjustment amount of the phase is zero.

7. The apparatus of claim 1, wherein a conductor which is not parallel to the current flowing in the load is provided on the magnetic film module.

8. The apparatus of claim 1 further comprising a display on which information according to a detection result of the voltage detector is displayed.

9. The apparatus of claim 1, wherein a variation of resistance of the magnetic film module is substantially constant with regard to a variation of an applied magnetic field.

10. A power measurement method configured to measure power consumed at a load, the method comprising:
    adjusting a pass-frequency and a phase of a current flowing through the adjuster from a magnetic film module arranged so that a longitudinal direction of the magnetic film module is parallel to current flowing in the load, a measurement resistance being serial-connected to the magnetic film module; and
    detecting a voltage between two terminals of the magnetic film module.

11. The method of claim 10, wherein upon adjusting the phase, the phase is adjusted so as to maximize the detected voltage between the two terminals of the magnetic film module, and
    the method further comprises calculating a power factor angle based on the phase when the detected voltage between the two terminals of the magnetic film module becomes maximum.

12. The method of claim 10, wherein upon adjusting the phase, the phase is adjusted so as to maximize the detected voltage between the two terminals of the magnetic film module, and
    the method further comprises calculating apparent power based on the detected voltage between the two terminals of the magnetic film when it becomes maximum.

13. The method of claim 10 further comprising calculating effective power based on the detected voltage between the two terminals of the magnetic film module when an adjustment amount of the phase is zero.

14. The method of claim 10, wherein a conductor which is not parallel to the current flowing in the load is provided on the magnetic film module.

15. The method of claim 10, wherein a variation of resistance of the magnetic film module is substantially constant with regard to a variation of an applied magnetic field.

* * * * *

UNITED STATES PATENT AND TRADEMARK OFFICE
CERTIFICATE OF CORRECTION

| | | |
|---|---|---|
| PATENT NO. | : 9,689,905 B2 | Page 1 of 1 |
| APPLICATION NO. | : 14/388419 | |
| DATED | : June 27, 2017 | |
| INVENTOR(S) | : Hiroaki Tsujimoto | |

It is certified that error appears in the above-identified patent and that said Letters Patent is hereby corrected as shown below:

In the Specification

Column 3, Line 32, "the coupling ends are" should read --the coupling ends 12 are--

Column 5, Lines 31-32, "a and R" should read --$\alpha$ and $\beta$--

Signed and Sealed this
Tenth Day of October, 2017

Joseph Matal
*Performing the Functions and Duties of the*
*Under Secretary of Commerce for Intellectual Property and*
*Director of the United States Patent and Trademark Office*